(12) United States Patent
Yang (10) Patent No.: US 7,529,018 B2
(45) Date of Patent: May 5, 2009

(54) TEMPERATURE ADAPTIVE OPTICAL MODULATOR

(75) Inventor: Jeong-Suong Yang, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 32 days.

(21) Appl. No.: 11/864,474

(22) Filed: Sep. 28, 2007

(65) Prior Publication Data

US 2008/0080036 A1   Apr. 3, 2008

(30) Foreign Application Priority Data

Oct. 2, 2006   (KR) ............... 10-2006-0097248

(51) Int. Cl.
*G02B 26/00* (2006.01)
*G02F 1/00* (2006.01)

(52) U.S. Cl. .............. 359/291; 359/290; 359/295; 359/323; 359/237

(58) Field of Classification Search .......... 359/197, 359/212, 223, 224, 237, 247, 254, 290, 295, 359/302, 318, 322, 323
See application file for complete search history.

(56) References Cited

U.S. PATENT DOCUMENTS 7,382,518 B2 *   6/2008   Kyoung ............... 359/291

FOREIGN PATENT DOCUMENTS

KR   10-2006-0089640 A   8/2006

* cited by examiner

*Primary Examiner*—Ricky L Mack
*Assistant Examiner*—Jack Dinh
(74) *Attorney, Agent, or Firm*—Christensen O'Connor Johnson Kindness PLLC (57) ABSTRACT

The present invention relates to a spatial optical modulator, more specifically to a temperature adaptive optical modulator. The spatial optical modulator according to an aspect of the present invention includes a substrate, an upper part of the substrate being doped; a structure layer, a center part of the structure layer being located at a predetermined distance from the substrate; driving means, located on the structure layer and allowing the center part of the structure layer to move upwardly and downwardly; an upper reflection layer, located in an upper part of the center part of the structure layer and reflecting and diffracting an incident beam of light; and a lower reflection layer, located on the substrate and reflecting and diffracting the incident beam of light by a stepped portion formed between the upper reflection layer and the lower reflection layer, below the structure layer. With the present invention, the spatial optical modulator can be efficiently operated regardless of the surrounding temperature.

7 Claims, 7 Drawing Sheets

TEMPERATURE ADAPTIVE OPTICAL MODULATOR

CROSS-REFERENCE TO RELATED PATENT APPLICATIONS

This application claims the benefit of Korean Patent Application No. 10-2006-0097248, filed on Oct. 2, 2006, in the Korean Intellectual Property Office, the disclosure of which is incorporated herein in its entirety by reference.

BACKGROUND OF THE INVENTION

1. Field of the Invention

The present invention relates to a spatial optical modulator, more specifically to a temperature adaptive optical modulator.

2. Background Art

Today's development of display technologies has increased the demands for realizing large-sized images. Most of the large-sized image display apparatuses (e.g. a projector) are currently using liquid crystal as optical switches. Liquid crystal projectors are more popular than conventional CRT projectors, due to their compact sizes, low prices and simpler optical systems. However, when light emitted from a light source passes through a liquid crystal film and is displayed on a screen, a lot of optical losses occur in the liquid crystal projector. Accordingly, a method for reducing the optical loss has been developed to display an image more brightly by employing a micro-machine such as a spatial optical modulator using reflection.

The micro-machine refers to a machine that is too small for a naked eye to be identified. This micro-machine can be referred to as a micro electro mechanical system (MEMS) or a micro electro mechanical device, which is created by applying semiconductor manufacturing technologies. The MEMS is applied for a lot of information apparatus elements, such as a magnetic head and an optical head, by using a micro optical device and an extreme device. The MEMS is also applied in the field of biomedicine and semiconductor manufacturing processes by using a variety of microfluidics. The micro-machine can be grouped into a micro sensor, functioning as a sensing device, a micro actuator, functioning as a driving device, and a miniature machine, transferring other types of energy.

The MEMS, which is one of various application fields, is being used for optical science. If the MEMS technologies is used, not only optical devices having a smaller size than 1 mm can be manufactured but also micro optical systems can be realized by using the optical devices.

Micro optical elements, such as optical modulators and micro lenses, which belong to the micro optical system, are employed and applied in communication apparatuses, displays and recording apparatuses, owing to their quick response, little loss, and easy integration and digital capabilities.

A spatial optical modulator (SOM), which is used for a scanning display apparatus, a type of display, is configured to include a driving integrated circuit and a plurality of micro-mirrors. At least one micro-mirror is used, to thereby represent a pixel of a projected image.

At this time, in order to represent light intensity of one pixel, the micro-mirror changes the quantity of modulated light by adjusting its displacement according to a driving voltage supplied from a driver IC. Here, the driver IC generates a driving voltage having particular relationship with an input signal.

However, the spatial optical modulator has its proper efficiency in a certain temperature environment. Particularly, in case that driving means driving the micro-mirror use a piezoelectric element, the spatial optical modulator has great efficiency in reflecting and diffracting an incident beam of light at a temperature of approximately 80 degrees Celsius. This is because the distance between the micro-mirrors can be sensitively varied depending on the temperature. Accordingly, it becomes necessary to develop a temperature adaptive optical modulator that can be operated efficiently even though a display apparatus is in an improper temperature environment.

SUMMARY OF THE INVENTION

The present invention provides a temperature adaptive optical modulator that can be efficiently operated regardless of the surrounding temperature.

The present invention provides a temperature adaptive optical modulator that can adaptively deal with the surrounding temperature by a simple method of doping a substrate.

Other problems that the present invention solves will become more apparent through the following description.

An aspect of the present invention features an optical modulator including a substrate, an upper part of the substrate being doped; a structure layer, a center part of the structure layer being located at a predetermined distance from the substrate; driving means, located on the structure layer and allowing the center part of the structure layer to move upwardly and downwardly; an upper reflection layer, located in an upper part of the center part of the structure layer and reflecting and diffracting an incident beam of light; and a lower reflection layer, located on the substrate and reflecting and diffracting the incident beam of light by a stepped portion formed between the upper reflection layer and the lower reflection layer, below the structure layer.

Here, the driving means can include a lower electrode; a piezoelectric layer, located on the lower electrode and providing an upward and downward driving force to the center part of the structure layer by being contracted or expanded according to a predetermined voltage; and an upper electrode, located on the piezoelectric layer and supplying the predetermined voltage to the piezoelectric layer formed between the upper electrode and the low electrode.

In addition, the doped substrate can be an n type semiconductor (n-Si) or a p-type semiconductor (p-Si).

An aspect of the present invention features an optical modulator including a substrate, an upper part of the substrate being doped; a structure layer, a center part of the structure layer being located at a predetermined distance from the substrate; driving means, located on the center part of the structure layer and allowing the center part of the structure layer to move upward and downward; an upper reflection layer, located in an upper part of the center part of the structure layer and reflecting and diffracting an incident beam of light; a lower reflection layer, located on the substrate and reflecting and diffracting the incident beam of light by a stepped portion formed between the upper reflection layer and the lower reflection layer, below the structure layer; a voltage supplying unit, supplying a voltage to a doped area of the substrate; a temperature measuring unit, measuring a temperature of a spatial optical modulator; and a voltage controlling unit, controlling the voltage supplying unit to supply a voltage to the doped area of the substrate if the temperature measured by the temperature measuring unit is the same as or lower than a reference temperature.

Here, the voltage supplied from the voltage supplying unit can be between 10V and 20V In addition, the doped substrate can be an n type semiconductor (n-Si) or a p-type semiconductor (p-Si).

BRIEF DESCRIPTION OF THE DRAWINGS

These and other features, aspects and advantages of the present invention will become better understood with regard to the following description, appended claims and accompanying drawings where:

Hereinafter, some embodiments of a temperature adaptive optical modulator in accordance with the present invention will be described in detail with reference to the accompanying drawings. Identical or corresponding elements will be given the same reference numerals, regardless of the figure number, and any redundant description of the identical or corresponding elements will not be repeated. Throughout the description of the present invention, when describing a certain technology is determined to evade the point of the present invention, the pertinent detailed description will be omitted. Also, the embodiment of the present invention can be applied to a MEMS package typically for transmitting a signal to the outside or receiving a signal from the outside. Before the detailed description related to the embodiment of the present invention, a spatial optical modulator, among the MEMS package applied by the present invention, will be firstly described.

The spatial optical modulator is mainly divided into a direct type, which directly controls the on/off state of light, and an indirect type, which uses reflection and diffraction. The indirect type can be further divided into an electrostatic type and a piezoelectric type. Here, the spatial optical modulator is applicable to the present invention regardless of the operation type.

An electrostatic type grating optical modulator includes a plurality of regularly spaced reflective ribbons having reflective surfaces and suspended above an upper part of the substrate, the spaced distances of the reflective ribbons being adjustable.

First, an insulation layer is deposited onto a silicon substrate, followed by depositions of a silicon dioxide film and a silicon nitride film. Here, the silicon nitride film is patterned with the ribbons, and some portions of the silicon dioxide film are etched such that the ribbons can be maintained by a nitride frame on an oxide spacer layer. The ribbon and the oxide spacer of the spatial optical modulator are designed to have a thickness of $\lambda_0/4$ in order to modulate a light beam having a single wavelength $\lambda_0$.

The grating amplitude of the modulator, limited to the vertical distance d between the reflective surfaces of the ribbons and the reflective surface of the substrate, is controlled by supplying a voltage between the ribbons (the reflective surface of the ribbon, which acts as a first electrode) and the substrate (the conductive film at the bottom portion of the substrate, which acts as a second electrode).

Figure 1A:
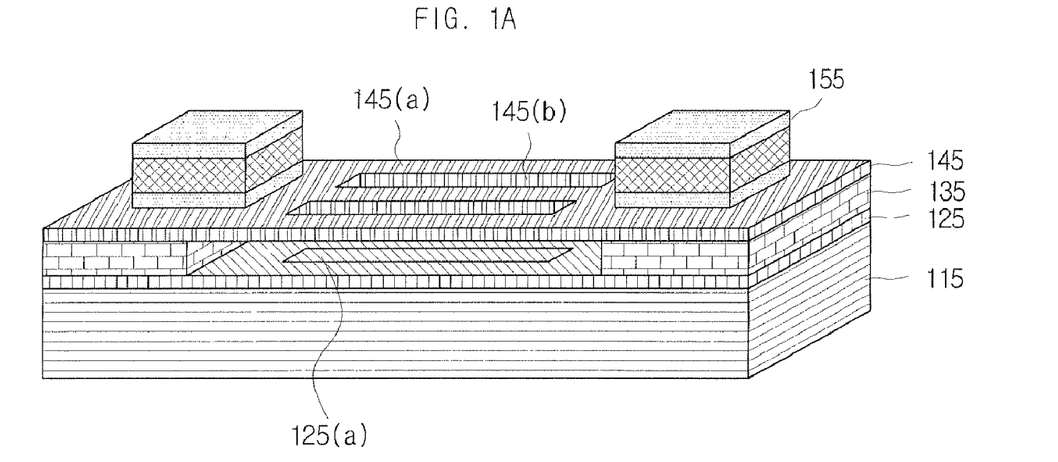
FIG. 1A is a perspective view showing a type of a diffractive optical modulator module using a piezoelectric element applicable to an embodiment of the present invention.
Figure 1B:
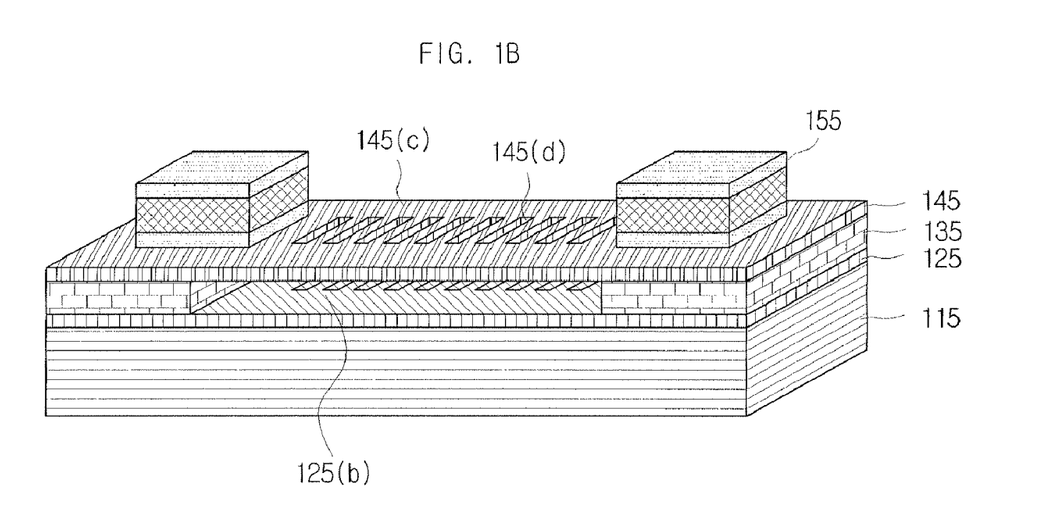
FIG. 1B is a perspective view showing another type of a diffractive optical modulator module using a piezoelectric element applicable to an embodiment of the present invention.

FIG. 1A is a perspective view showing a type of a diffractive optical modulator module using a piezoelectric element applicable to an embodiment of the present invention, and FIG. 1B is a perspective view showing another type of a diffractive optical modulator module using a piezoelectric element applicable to an embodiment of the present invention. Referring to FIG. 1A and FIG. 1B, the optical modulating device includes a substrate 115, an insulation layer 125, a sacrificial layer 135, a ribbon structure 145 and a piezoelectric element 155. Here, the piezoelectric element 155 can be typically used as one of the driving means The substrate 115 is a commonly used semiconductor substrate, and the insulation layer 125 is deposited as an etch stop layer. The insulation layer 125 is formed from a material with a high selectivity to the etchant (an etching gas or an etching solution) that etches the material used as the sacrificial layer 135. Here, a lower reflective layer 125(a) or 125(b) can be formed on the insulation layer 125 to reflect incident beams of light.

The sacrificial layer 135 supports the ribbon structure 145 at opposite side parts such that the ribbon structure 145 can be spaced by a regular gap from the insulation layer 125, and forms a space in the center part.

The ribbon structure 145, as described above, creates diffraction and interference in the incident light to perform optical modulation of signals. The form of the ribbon structure 145, as described above, can be configured in a plurality of ribbon shapes in the electrostatic type, or can include a plurality of open holes in the center portion of the ribbons in the piezoelectric type. Also, the piezoelectric element 155 controls the ribbon structure 145 to move upwardly and downwardly according to upward and downward, or leftward and rightward contraction or expansion levels generated by the difference in voltage between the upper and lower electrodes. Here, the lower reflective layer 125(a) or 125(b) is formed in correspondence with the holes 145(b) or 145(d) formed in the ribbon structure 145.

For example, in case that the wavelength of a beam of light is $\lambda$, when there is no power supplied or when there is a predetermined amount of power supplied, the gap between an upper reflective layer 145(a) or 145(c), formed on the ribbon structure 145, and the insulation layer 125, formed with the lower reflective layer 125(a) or 125(b), is equal to $n\lambda/2$, n being a natural number. Accordingly, in the case of a $0^{th}$-order diffracted (reflected) beam of light, the overall path length difference between the light reflected by the upper reflective layer 145(a) or 145(c) formed on the ribbon structure 145 and the light reflected by the insulation layer 125 is equal to $n\lambda$, so that constructive interference occurs and the diffracted light renders its maximum luminance. In the case of the $+1^{st}$ or $-1^{st}$ order diffracted light, however, the luminance of the light is at its minimum value due to destructive interference.

Also, when a predetermined amount of power, which is different from the supplied power mentioned above, is supplied to the piezoelectric elements 155, the gap between the upper reflective layer 145(a) or 145(c) formed on the ribbon structure 145 and the insulation layer 125, formed with the lower reflective layer 125(a) or 125(b), becomes (2n+1)λ/4, n being a natural number. Accordingly, in the case of a $0^{th}$-order diffracted (reflected) beam of light, the overall path length difference between the light reflected by the upper reflective layer 145(a) or 145(c) formed on the ribbon structure 145 and the light reflected by the insulation layer 125 is equal to (2n+1)λ/2, so that destructive interference occurs, and the diffracted light renders its minimum luminance. In the case of the $+1^{st}$ or $-1^{st}$ order diffracted light, however, the luminance of the light is at its maximum value due to constructive interference. As a result of such interference, the spatial optical modulator can load signals on the beams of light by adjusting the quantity of the reflected or diffracted light.

Although the foregoing describes the cases in which the gap between the ribbon structure 145 and the insulation layer 125, formed with the lower reflective layer 125(a) or 125(b), is nλ/2 or (2n+1)λ/4, it is obvious that a variety of embodiments, which are able to operate with a gap adjusting the intensity of interference by diffraction and reflection of the incident light, can be applied to the present invention.

The below description will focus on a spatial optical modulator illustrated in FIG. 1A and described above.

Figure 1C:
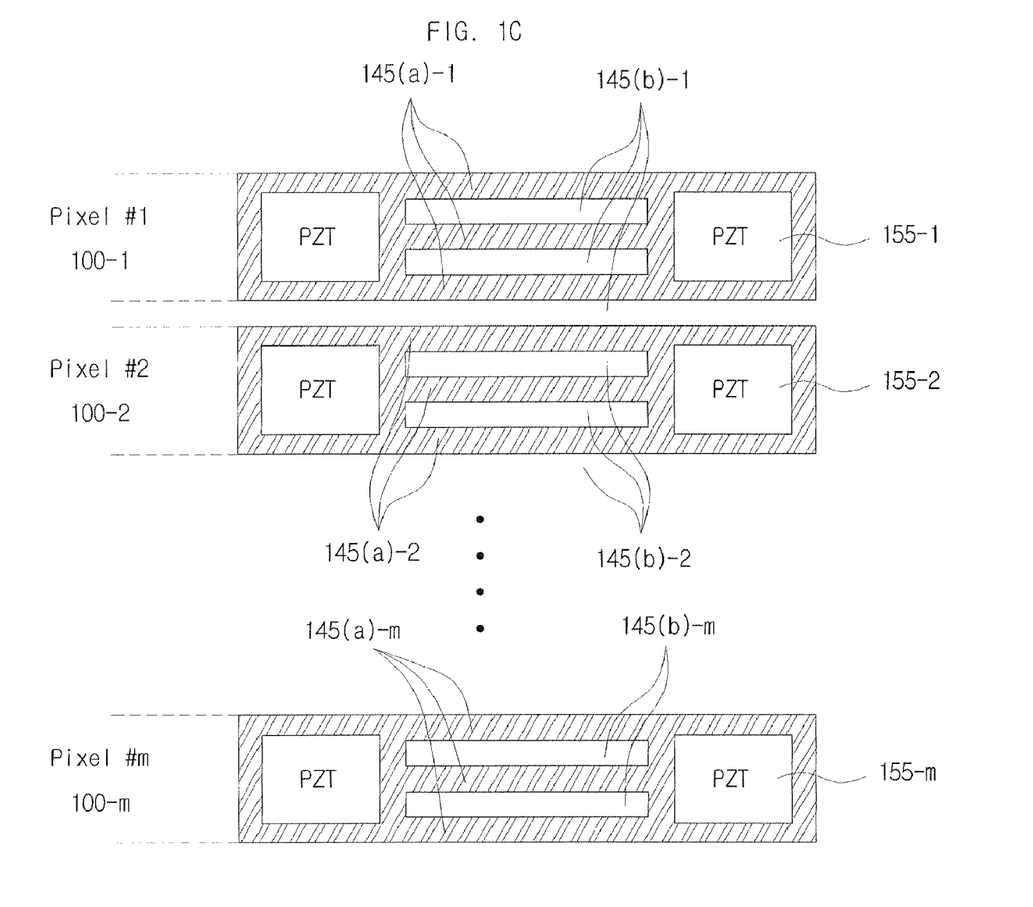
FIG. 1C is a plan view showing a diffractive optical modulator array applicable to an embodiment of the present invention.

Referring to FIG. 1C, the spatial optical modulator is configured to include m micro-mirrors 100-1, 100-2, ..., and 100-m, each of which corresponds to a first pixel (pixel #1), a second pixel (pixel #2), ..., and an $m^{th}$ pixel (pixel #m), respectively, m being a natural number. The spatial optical modulator deals with image information with respect to 1-dimensional images of vertical or horizontal scanning lines (which are assumed to consist of m pixels), while each micro-mirror 100 deals with one pixel among the m pixels constituting the vertical or horizontal scanning line. Thus, the light reflected or diffracted by each micro-mirror is later projected as a 2-dimensional image to a screen by an optical scanning device. For example, in the case of an image having a VGA resolution of 640*480, modulation is performed 640 times for one surface of the optical scanning device for 480 vertical pixels, to thereby generate 1 frame of display per surface of the optical scanning device. Here, the optical scanning device can be a polygon mirror, a rotating bar, or a Galvano mirror, for example.

While the description below of the principle of optical modulation concentrates on the first pixel (pixel #1), the same can obviously apply to other pixels.

In the present embodiment, it is assumed that the number of holes 145(b)-1 formed in the ribbon structure 145 is two. Because of the two holes 145(b)-1, there are three upper reflective layers 145(a)-1 formed on an upper part of the ribbon structure 145. On the insulation layer 125, two lower reflective layers are formed in correspondence with the two holes 145(b)-1. Also, there is another lower reflective layer formed on the insulation layer 125 in correspondence with the gap between the first pixel (pixel #1) and the second pixel (pixel #2). Accordingly, the number of the upper reflective layers 145(a)-1 is identical to that of the lower reflective layers per pixel, and as discussed with reference to FIG. 1A, it is possible to control the luminance of the modulated light by using the $0^{th}$-order diffracted light or $±1^{st}$-order diffracted light.

Figure 1D:
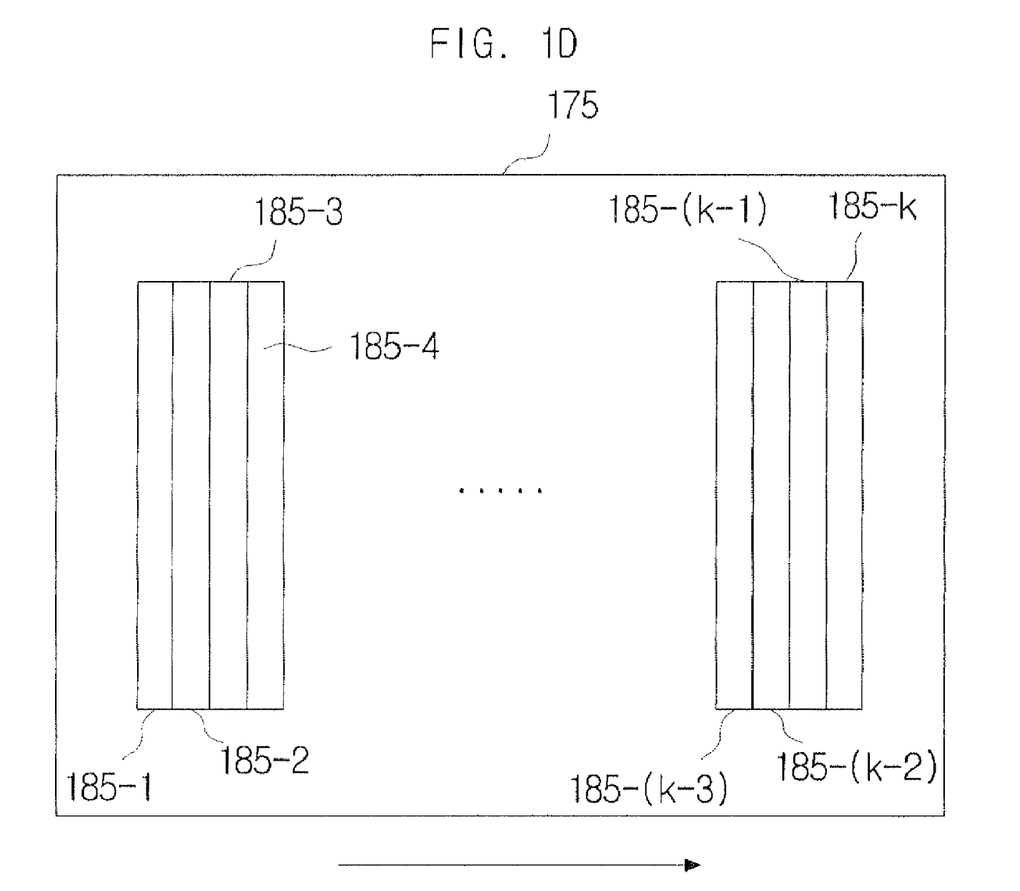
FIG. 1D is a schematic view of a screen generated with an image by a diffractive optical modulator array applicable to an embodiment of the present invention.

FIG. 1D is a schematic view showing a screen generated with an image by a diffractive optical modulator array applicable to an embodiment of the present invention.

Lights reflected and/or diffracted by vertically arranged m micro-mirrors 100-1, 100-2, ..., and 100-m are reflected by the optical scanning device and then scanned horizontally onto a screen 175, to thereby generate pictures 185-1, 185-2, 185-3, 185-4, ..., 185-(k-3), 185-(k-2), 185-(k-1), and 185-k. One image frame can be projected in the case of one rotation of the optical scanning device. Here, although the scanning is performed from the left to the right (the arrow indicating the direction), it is apparent that images can be scanned in another direction (e.g. in the opposite direction).

The above description is related to the perspective and plan views generally illustrating the temperature adaptive optical modulator. Described below is certain embodiment of a temperature adaptive optical modulator in accordance with the present invention.

Figure 2:
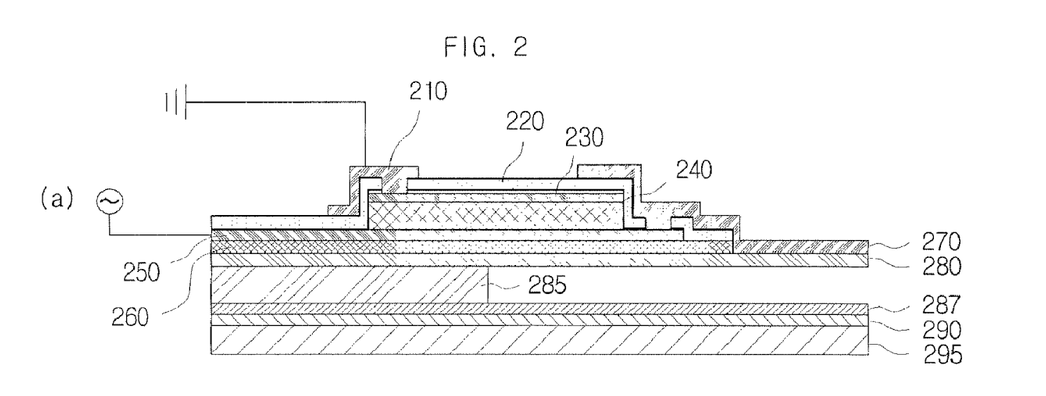
FIG. 2 is a sectional view showing a diffractive optical modulator in accordance with an embodiment of the present invention.
Figure 3:
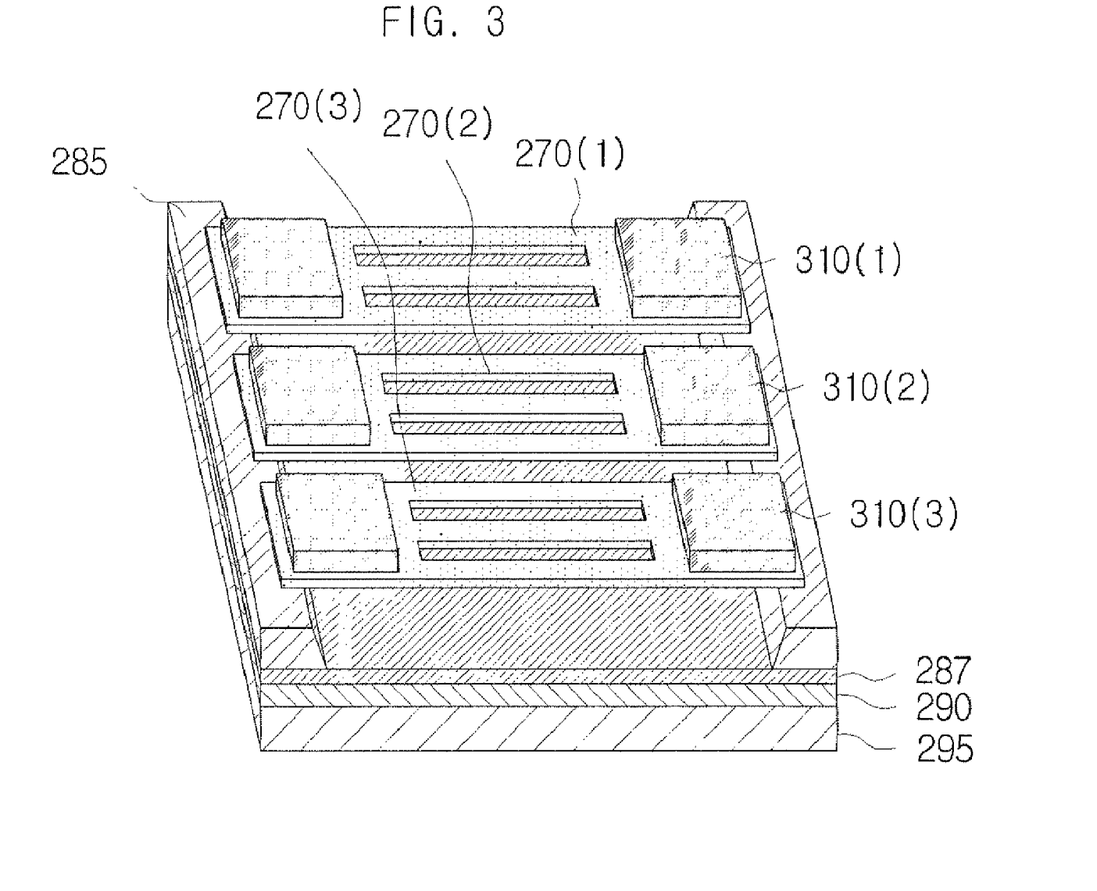
FIG. 3 is a side view showing a diffractive optical modulator in accordance with an embodiment of the present invention.

FIG. 2 is a sectional view showing a diffractive optical modulator in accordance with an embodiment of the present invention, and FIG. 3 is a side view showing a diffractive optical modulator in accordance with an embodiment of the present invention. Referring to FIG. 2 and FIG. 3, the diffractive optical modulator includes a substrate 295, a doping material 290, a first insulation layer 287, a first sacrificial layer 285, a second insulation layer 280, an upper reflection layer 270, a second sacrificial layer 260, a lower electrode 250, a piezoelectric layer 240, an upper electrode 230, a third sacrificial layer 220 and a ground electrode 210. Here, referring to FIG. 3, the lower electrode 250, the piezoelectric layer 240 and the upper electrode 230 are divided as piezoelectric elements 310(1), 310(2) and 310(3), each of which has the lower electrode 250, the piezoelectric layer 240 and the upper electrode 230. The coupling relationship of the upper reflection layer 270 and each piezoelectric element 310(1), 310(2) and 310(3) is simplified for the convenience of description.

FIG. 2 illustrates a half part, which is one of the opposite sides, of the spatial optical modulator. The below description focuses on the difference as described with reference to FIG. 1A through FIG. 1C.

As described above, the sacrificial layer supports the structure layer (i.e. the ribbon structure) at opposite side parts such that the structure layer can be spaced by a gap from the first insulation layer 287, and forms a space in the center part. In other words, the sacrificial layer allows a necessary part to be etched to form the spatial optical modulator illustrated in FIG. 2. Accordingly, in order to form the structure layer as described above, the sacrificial layer includes the first sacrificial layer 285, the second sacrificial layer 260 and the third sacrificial layer 220, but the present invention is not limited to this type.

Here, the structure layer refers to the second insulation layer 280. The meaning of the structure layer can further include the sacrificial layer 260. In other words, the structure layer refers to the structure whose center part is located at a predetermined distance from the substrate 295.

If a voltage a is supplied to the lower electrode 250, a voltage difference occurs between the lower electrode 250 and the upper electrode 230 coupled to the ground electrode 210. The center part of the second insulation layer 280 can be vertically moved by the piezoelectric element 240 contracted or expanded by the voltage difference between the lower electrode 250 and the upper electrode 230.

The doping material 290 refers to a material added in order to supply a voltage to the substrate 295. In other words, the substrate 295 is typically made by using silicon (Si), and particularly, the substrate 295 can be made as an n type semiconductor (n-Si) by adding phosphorus (P), arsenic (As) and stibium (Sb) into the substrate 295 or as a p-type semiconductor (p-Si) by adding boron (B) and indium (In) into the substrate 295.

If a predetermined voltage is supplied to a doped area of the substrate 295 and a charge is accumulated, an electrostatic force occurs between the substrate 295 and the upper reflection layer 270 in case that the upper reflection layer 270 is a conductor (e.g. Al). In case that lowering surrounding temperature causes a center part of the second insulation layer 280 to rise to its upper part, this electrostatic force (i.e. attraction) can allow the height of the center part of the second insulation layer 280 to be adjusted.

Figure 4:
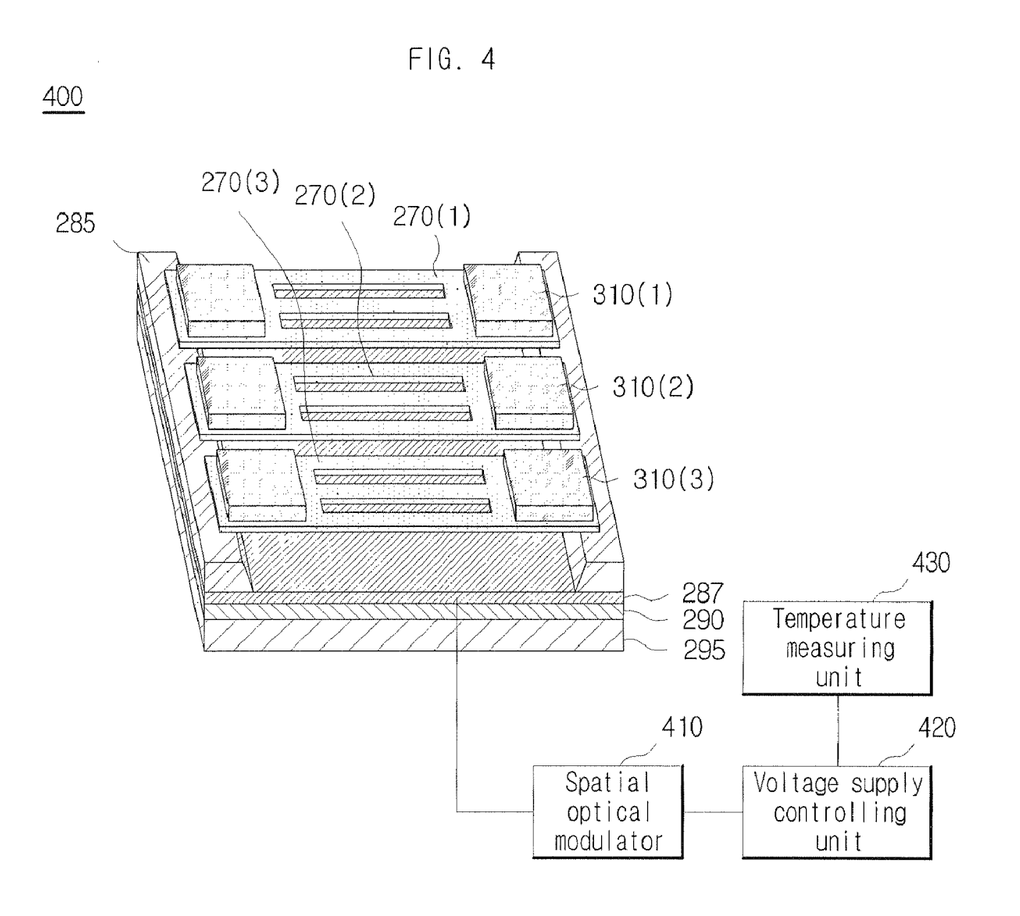
FIG. 4 is a system diagram illustrating a system including a diffractive optical modulator in accordance with an embodiment of the present invention.

FIG. 4 is a system view showing a system including a diffractive optical modulator in accordance with an embodiment of the present invention. Referring to FIG. 4, a spatial optical modulator 400, a voltage supplying unit 410, a voltage supply controlling unit 420 and a temperature measuring unit 430 are illustrated.

The voltage supplying unit 410 supplies a voltage to the doped area of the substrate 295 in order to allow an electrostatic force to be generated between the substrate 295 and the upper reflection layer 270 as described above. Here, the voltage supplied from the voltage supplying unit 410 can be between 10V and 20V. In other words, considering the weight of the upper reflection layer 270 and the thickness and conductivity of the second insulation layer 280, in case that the supplied voltage is between 10V and 20V, the height of the upper reflection layer 270 can be adjusted.

The voltage supply controlling unit 420 controls whether the voltage supplying unit 410 supplies a voltage to the doped area of the substrate 295. In other words, if the temperature measured by the temperature measuring unit 430 is lower than a reference temperature, the voltage supply controlling unit 420 controls the voltage supplying unit 410 to supply a voltage to the doped area of the substrate 295. Here, the reference temperature can be approximately 80 degrees Celsius, which can be a temperature for the spatial optical modulator to operate properly.

The temperature measuring unit 430 measures the surrounding temperature of the optical modulator 400 and allows the voltage supply controlling unit 420 to use the measured temperature data. Here, there can be various methods by which the temperature measuring unit 430 measures temperature.

For example, the temperature measuring unit 430 can be embodied by using a resistance temperature detector (RTD) or thermocouples. The RTD uses a resistance-to-temperature output. Since the RTD is a passive element, approximately 1 mA is required to operate the RTD. The RTD can be made of platinum, nickel, copper or nickel/iron. In case that end parts of different kinds of metals contact each other, the temperature difference occurs in the contacting part. This leads to a thermoelectromotive, to thereby generate a current. The thermocouples measure the temperature by using this method. Here, the temperature measuring unit 430 can be equipped with the RTD and the thermocouples by forming a dummy micro-mirror (upper reflection layer) in an end part of the spatial optical modulator 400 and forming a metal in an upper part of the dummy micro-mirror.

Although a preferred embodiment of the present invention has been described, anyone of ordinary skill in the art to which the invention pertains should be able to understand that a very large number of permutations are possible without departing the spirit and scope of the present invention, which shall only be defined by the claims appended below.

What is claimed is:

1. A spatial optical modulator, comprising:
   a substrate, an upper part of the substrate being doped;
   a structure layer, a center part of the structure layer being located at a predetermined distance from the substrate;
   driving means, located on the structure layer and allowing the center part of the structure layer to move upwardly and downwardly;
   an upper reflection layer, located in an upper part of the center part of the structure layer and reflecting and diffracting an incident beam of light; and
   a lower reflection layer, located on the substrate and reflecting and diffracting the incident beam of light by a stepped portion formed between the upper reflection layer and the lower reflection layer, below the structure layer.

2. The spatial optical modulator of claim 1, wherein the driving means comprises
   a lower electrode;
   a piezoelectric layer, located on the lower electrode and providing an upward and downward driving force to the center part of the structure layer by being contracted or expanded according to a predetermined voltage; and
   an upper electrode, located on the piezoelectric layer and supplying the predetermined voltage to the piezoelectric layer formed between the upper electrode and the low electrode.

3. The spatial optical modulator of claim 1, wherein the doped substrate is an n type semiconductor (n-Si) or a p-type semiconductor (p-Si).

4. An optical modulating system, comprising:
   a substrate, an upper part of the substrate being doped;
   a structure layer, a center part of the structure layer being located at a predetermined distance from the substrate;
   driving means, located on the center part of the structure layer and allowing the center part of the structure layer to move upward and downward;
   an upper reflection layer, located in an upper part of the center part of the structure layer and reflecting and diffracting an incident beam of light;
   a lower reflection layer, located on the substrate and reflecting and diffracting the incident beam of light by a stepped portion formed between the upper reflection layer and the lower reflection layer, below the structure layer;
   a voltage supplying unit, supplying a voltage to a doped area of the substrate;
   a temperature measuring unit, measuring a temperature of a spatial optical modulator; and
   a voltage controlling unit, controlling the voltage supplying unit to supply a voltage to the doped area of the substrate if the temperature measured by the temperature measuring unit is the same as or lower than a reference temperature.

5. The optical modulating system of claim 4, wherein the voltage supplied from the voltage supplying unit is between 10V and 20V.

6. The optical modulating system of claim 4, wherein the doped substrate is an n type semiconductor (n-Si) or a p-type semiconductor (p-Si).

7. The optical modulating system of claim 4, wherein the temperature measuring unit comprises a resistance temperature detector or thermocouples.

* * * * *